United States Patent
Silva et al.

[11] Patent Number: 6,127,899
[45] Date of Patent: Oct. 3, 2000

[54] HIGH FREQUENCY ANHARMONIC OSCILLATOR FOR THE GENERATION OF BROADBAND DETERMINISTIC NOISE

[75] Inventors: Christopher Patrick Silva, Rancho Palos Verdes; Albert Miebach Young, Whittier, both of Calif.

[73] Assignee: The Aerospace Corporation, El Segundo, Calif.

[21] Appl. No.: 09/322,891

[22] Filed: May 29, 1999

[51] Int. Cl.[7] .................................................. H03B 29/00
[52] U.S. Cl. ...................... 331/78; 331/117 FE; 331/167; 331/172
[58] Field of Search .................................. 331/78, 117 R, 331/117 FE, 167, 172

[56] References Cited

U.S. PATENT DOCUMENTS 5,818,712 10/1998 Glenn, Sr. et al. ................. 364/148.09
6,064,701 5/2000 Tresser et al. ........................... 375/285

OTHER PUBLICATIONS

Guckenheimer, J., Homes, P., "Nonlinear Oscillations, Dynamical Systems, and Bifurcations of Vector Fields," Springer–Verlag, pp. 81–91, New York 1993.

Chua, L. O. and Lin, G., "Canonical Realization of Chua's Circuit Family," IEEE Transactions, vol. 37 (No. 7), pp. 885–902, (Jul. 24, 1990).

Mogel, A., Schwarz, W., Lukin, K., Zemlyanoy, O., "Chaotic Wide Band Oscillator With Delay Line," Proc. of the 3rd Int'l Specialist Workshop on Nonlinear Dynamics, pp. 259–262, (Jul. 28, 1995).

Murali, K., Lakshmanan, M., Chua, L., "Bifurcation and Chaos in the Simplest Dissipative Non–Autonomous Circuit," Int'l Journal of Bifurcation and Chaos, World Scientific Publishing Company, vol. 4 (No. 6), pp. 1511–1524, (May 24, 1994).

*Primary Examiner*—Siegfried H. Grimm
*Attorney, Agent, or Firm*—Derrick Michael Reid

[57] ABSTRACT

A high frequency anharmonic oscillator provides a broad band chaotic oscillation with a noise-like spectra. The oscillator output signal is suitable for modulation by data providing for improved secure communication. The chaotic oscillator is based upon a forced second order Duffing equation that is tolerant of delay in the feedback path for high frequency operation.

20 Claims, 5 Drawing Sheets

SINGLE-ENDED SERIES FORCED OSCILLATOR CIRCUIT

PIECEWISE-LINEAR APPROXIMATION TO THE
CUBIC POTENTIAL FUNCTION

FIG. 1

STATE VARIABLE POWER SPECTRA

FIG. 2

SERIES FORCED OSCILLATOR

FIG. 3

PARALLEL FORCED OSCILLATOR

FIG. 4

SINGLE-ENDED SERIES FORCED OSCILLATOR CIRCUIT

FIG. 5

PUSH PULL PARALLEL FORCED OSCILLATOR CIRCUIT

FIG. 6

NONLINEAR HYBRID CURRENT AMPLIFIER

FIG. 7

LINEAR HYBRID CURRENT AMPLIFIER

FIG. 8

HIGH FREQUENCY ANHARMONIC OSCILLATOR FOR THE GENERATION OF BROADBAND DETERMINISTIC NOISE

STATEMENT OF GOVERNMENT INTEREST

The invention was made with Government support under contract No. F04701-93-C-0094 by the Department of the Air Force. The Government has certain rights in the invention.

FIELD OF THE INVENTION

The invention relates to the field of deterministic noise or chaos generation by anharmonic oscillators. More particularly, the present invention relates to a chaotic oscillator operative at high frequencies over a broad band that is suitable for communicating data.

BACKGROUND OF THE INVENTION

In traditional RF communications, a message in analog or digital data, audio, or video communications is impressed in various ways on a RF sinusoidal carrier at the transmitter, and a faithful reproduction of the original message is recovered from this modulated signal at the receiver. This transmitter modulation and receiver demodulation process relies on the classical synchronization or entrainment of periodic signals that has been well established for decades, resulting in a myriad of strategies to enhance the synchronization process and to overcome the many impairments to the modulated signal that can take place in a communication channel between the transmitter and receiver. Currently these systems are dominated by digital implementations, wherein the original analog message is sampled, quantized, encrypted, and error-correction encoded to provide the resulting digital data stream. The data in the data stream is then grouped into a finite number of symbol states that are modulated onto an RF carrier in a manner suitable for demodulation upon reception. While suitable in many communication applications, there still are several applications where digital technology does not sufficiently meet performance demands, thereby still requiring the use of analog communications.

With the advent of chaotic synchronization, researchers have begun to explore the replacement of the sinusoidal carrier with a generalized chaotic carrier in order to exploit the special properties of chaos and chaotic synchronization. In addition to the many means discovered to achieve chaotic synchronization, there have also been an equally large set of techniques developed to combine the chaos with the message in a recoverable manner. Two of the four basic forms of chaotic synchronization are considered to illustrate chaotic synchronization techniques applicable to communications. In one form, an original and most often used master-slave form is usually based on unforced chaotic oscillators, whereas the second form is a non-autonomous form that employs forced chaotic oscillators. In the simplest case of the master-slave approach, an autonomous unforced or self-oscillating chaotic system is divided into two subsystems, one of which is replicated remotely and called the response subsystem, while the other is a drive subsystem used to unidirectionally drive the response subsystem through a communication channel, as do traditional transmitters and receivers. The replicated response subsystem and drive subsystems must be of identical topology with precise parameter matching for synchronization. Such chaotic communication systems provide for the enhanced security of the communication channel due to the inherent noise resemblance of the chaotic carrier signal. The remaining driving subsystem is usually chosen to be one dimensional in view of channel bandwidth efficiency considerations. These chaotic systems may include rigorous conditions for lock and system decomposition methods.

A more recent approach involves the use of identical non-autonomous, forced chaotic systems. In the forced chaotic communication systems, the drive and response systems are unidirectionally linked, again preferably through only one state variable, and the frequency $\omega^R$ and phase $\phi^R$ of the receiver forcing function is adaptively adjusted to achieve lock through the use of an error signal, derived from an x driving signal and the locally generated x' response signal. This forced chaotic system generalizes the classical phase locked loop for sinusoidal signals. Such an arrangement has been shown to be significantly robust to channel interference favorable for real world applications.

The motivation for applying chaos to communications lies in the basic aspects associated with the carrier, namely, the generation, synchronization, modulation and demodulation with information. The basic characteristics of chaos, specifically its noise resemblance spectral appearance generated from a well defined and often simple underlying dynamical rule, renders chaotic signals a natural candidate for hiding information with the dynamical rule as the key, implying both low probability of intercept and encryption capabilities. The synchronization process itself may prove superior to classical acquisition schemes with respect to speed, robustness, immunity to channel impairments and filtering, and implementation complexity. Furthermore, chaotic modulation may provide many new capabilities not even possible with traditional approaches, such as unique privacy and frequency re-use features for analog communications, tolerance to amplifier nonlinearities, and indirect schemes that have enhanced security and multiplexing characteristics.

The first and most fundamental task in developing chaos-based communications is the hardware design and implementation of the chaotic carrier generator. These chaotic generators must be readily designed, fabricated, and matched, and have the reliability of traditional sinusoidal carrier generators in order to compete with current communication systems. At this early stage in the technology development, the design of chaotic dynamical systems, let alone realizable hardware implementations, is essentially an art with very few systematic guidelines. One historical factor that has caused this situation is that chaos has become a desired behavior in engineering systems only recently marked by the announcement of chaotic synchronization. In the same way, it is only recently that powerful simulation tools have become readily available to allow the numerical experiments needed to investigate chaotic systems.

Several chaos implementations have emerged, divided between those that operate at baseband frequencies and those that run at the higher radio frequency (RF) and microwave regime. Either of these generator classes can be applied to RF communications, with the first requiring traditional frequency upconversion and downconversion. The first class consists of autonomous analog oscillator circuits, such as the canonical piecewise-linear (PWL) Chua circuit, consists of nonautonomous analog oscillator circuits, such as the forced Chua circuit, and consists of mapping-based digital circuits. The autonomous canonical PWL Chua circuit oscillator was among the first investigated to serve as the basis for a high-frequency chaos-based communications link. The oscillator circuit includes a realization of a single nonlinear resistor providing a representative PWL I-V characteristic that is locally active and globally passive.

The well-known Duffing equation is one of several prototypical nonautonomous systems that can exhibit chaotic behavior and emerged in the study of mechanical systems typically that operate in the low frequency regime. The mechanical systems described by the Duffing equation and that can produce chaotic behavior do not use feedback. As a consequence, these systems do not address problems relating to the use of feedback, such as phase delay in the feedback path.

The second class of implementations consists of suitably driven analog phase-locked loops that can place, through a frequency modulation process, a desired bandwidth of chaos around a chosen RF carrier frequency, and contains a baseband oscillator based on the use of active circuits that produce negative resistance, such as those containing diodes and transistor amplifiers.

It is desirable to handle wideband data streams that are common in military and commercial systems, such as high-resolution imagery and broadcast quality video, respectively. The bandwidth of the chaotic carrier must necessarily be larger than that of the message. Wideband chaotic oscillators can be an alternative to the second class of oscillators that can have some limitations in wideband data stream communication applications. These wideband oscillators could provide carriers for RF communications, or provide a subcarrier placed upon a traditional sinusoidal carrier at some desired center frequency.

Several modulation methods have been proposed that reversibly combine information with the signal produced by a chaotic generator. These methods include additive masking, angle modulation, multiplicative mixing, chaos shift keying, generalized modulation, and indirect parameter modulation, as well as forming chaotic signal constellations by applying control chaos techniques to the generator. It is clear that whatever method is used, the channel bandwidth will be limited by the bandwidth of the generator. For this reason, and in order to provide communications capabilities for wideband information payloads, such as high-resolution imagery and video, it is extremely desirable to extend the generator bandwidth as much as possible. Prior systems have not effectively exploited the increased bandwidth available from an enhanced chaotic carrier generator.

To date, most of the methods used to generate chaotic oscillations fall into four main categories, mapping-based digital circuits, forced or unforced baseband analog circuits, microwave analog circuits based on active tunnel-effect devices, and suitably driven analog phase-locked loops (PLLs). The output spectrum of the digital circuits is limited to a fraction of the clock rate of the digital circuitry used to implement the map. Baseband analog circuits have relied on the production of negative resistance, an impedance with a large negative real part, using operational amplifiers or discrete transistors. This impedance will not be frequency independent at higher operating frequencies due to propagation delay and other parasitics within the amplifiers used in production of the high operating frequencies. This propagation delay severely limits the bandwidth of the resulting chaotic generator. Tunnel-effect devices are capable of operation at microwave frequencies, but contain inherent nonlinearities that are difficult to control because the I-V and Z-V characteristics are semiconductor process dependent. These inherent nonlinearities translate into difficulty in synchronizing two supposedly identical generators. The PLL approach is a means to frequency modulate a voltage controlled oscillator (VCO) with a baseband chaotic signal. The modulation index determines the extent to which the baseband signal is spread over the output spectrum. This PLL approach can be enhanced as the bandwidth of the modulating signal is increased.

There exist other techniques of generating chaos, including using echoes in an electrically long unterminated transmission line placed in a feedback path around a nonlinear amplifier, and repeated frequency multiplication of a baseband chaotic signal, for which synchronization has not been demonstrated, and is likely to be difficult to achieve. In particular, for the nonlinear amplifier with echoing transmission line feedback, an infinite dimensional system results with behavior that is quite sensitive to the value of the delay, a negative attribute for synchronization purposes. The sequential frequency multiplication approach has an ill-defined dynamical system and an implementation that will make it difficult to systematically synchronize. These and other disadvantages are solved or reduced using the invention.

SUMMARY OF THE INVENTION

An object of the invention is to provide a chaotic oscillator having high frequency broadband spectra.

Another object of the invention is to provide a chaotic signal suitable for use as a communication carrier signal.

Yet another object of the invention is to provide a chaotic signal suitable for use as a communication carrier signal to enhance privacy as an additional layer of transmission security with a low probability of intercept.

Another object of the invention is to provide a chaotic oscillator in a transmitter and in a receiver having exactly matched topology and having control over parameter matching to ensure synchronization in a communication system.

A further object of the invention is to provide a chaotic oscillator providing a chaotic carrier signal enabling unique privacy and frequency reuse abilities for analog communication systems.

This invention is directed to a generator for generating very high frequency, broadband, chaotic electrical signals, referred to as a chaotic oscillator. These signals can be used to carry information in the same way that a modulated sinusoidal carrier is used in a conventional communications system. The word chaotic means that the signal resembles noise in spectra but is really deterministic in nature, being produced by an underlying well defined dynamical system. Because of this fundamental noise like property, chaotic synchronization, a generalization of traditional sinusoidal synchronization that is commonly found in current communications systems, can be applied to secure data communication links. For the most part, chaos based communications have been restricted to the low frequency spectra due to the difficulty in generating, modulating, and recovering information from high frequency chaotic signals. These low frequency circuits are referred to as baseband circuits. The chaotic oscillator may be used for modulation by data for information recovery from high frequency, broadband chaotic signals. The chaotic oscillator allows the spectrum over which a specific chaotic carrier can be used, to extend from near DC, through the baseband region, and into the microwave region. The chaotic oscillator is a key element in the implementation of a chaos based communications system that can meet current and future information capacity and performance requirements.

The chaotic oscillator generates a high-frequency chaotic carrier that does not depend on the production of a frequency-independent negative resistance, and is quite tolerant of propagation delay in the associated amplifiers. Also, all the parameters of the oscillator are easily tuned as a function of circuit element values. There are two forms of the oscillator circuit, a series implementation, and a parallel implementation. The required nonlinearity is ideally a piecewise linear (PWL) function that can be produced by a diode limiter that controls one of two feedback paths. Conceptually, the oscillator consists of a passive subcircuit containing inductance, capacitance, and resistance, that is, an RLC subcircuit, wideband differential amplifiers, a diode limiter, and a source of sinusoidal forcing. The oscillator is relatively simple in construction and produces broadband chaotic signals. A generator using this oscillator has a relatively flat power density spectrum that extends up to a corner frequency, at which point the spectrum rolls off gracefully. The corner frequency can be placed well above the frequency of the forcing function. In addition, angle modulation of a sinusoidal forcing function provides one convenient means by which to modulate the chaotic output signal, or to synchronize one generator with another, a function found in a typical receiver. These and other advantages will become more apparent from the following detailed description of the preferred embodiment.

DETAILED DESCRIPTION OF THE PREFERRED EMBODIMENT

Figure 1:
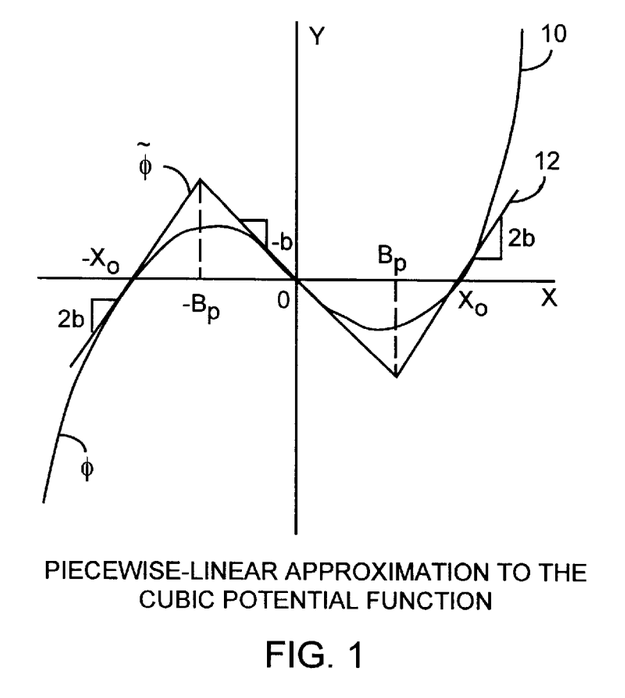
FIG. 1 is a graph of a piecewise linear approximation of $\phi$ to a cubic potential function $\phi$.
Figure 2:
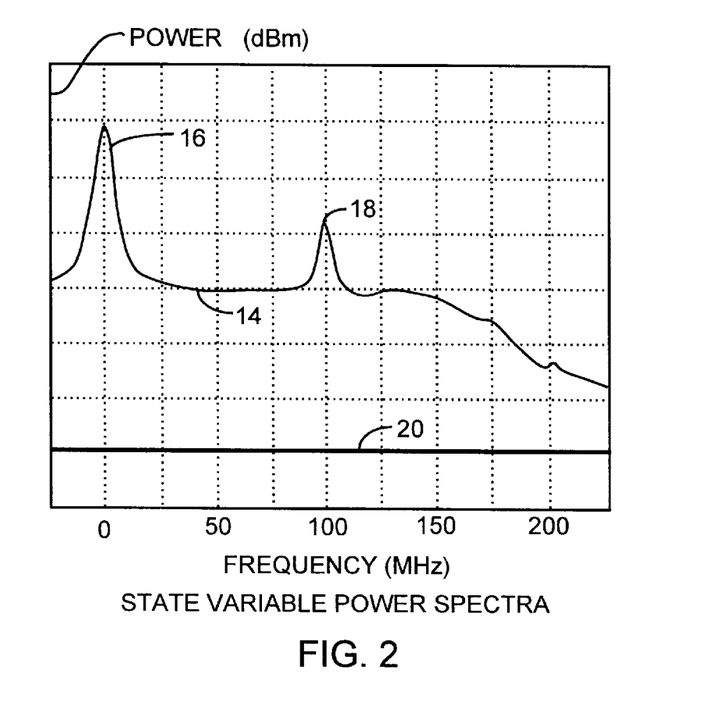
FIG. 2 is a power spectra graph for a primary state variable of a chaotic oscillator.

An embodiment of the invention is described with reference to the figures using reference designations as shown in the figures. Referring to FIGS. 1 and 2, a chaotic oscillator is based upon the nonlinearity function 10 that is approximated by a piecewise linear (PWL) potential function 12. The PWL potential function 12 is an integral part of the chaotic oscillator that generates a broad-spectrum signal 14 relative to a noise floor power level 20. The DC peak 16 includes the standard spectrum analyzer artifact, and peak 18 corresponds to the forcing frequency and can be reduced by tuning, or removed from the output by filtering. The design approach is based on the Duffing equation which is a second-order, nonlinear, nonautonomous, forced, differential equation, having a potential function manifesting the required nonlinearity. A convenient form of this equation employs a third-degree polynomial potential $\phi(\text{dot})$.

$$\ddot{x} + k\dot{x} + \phi(x) = F(t), \quad \phi(x) = ax^3 - bx$$

The term x equals x(t) and represents a state variable for the system. The term k is a coefficient of linear kinetic friction. The terms a and b are positive constants. The term F(t) is the forcing function that is usually sinusoidal, but can be any periodic function. The approach approximates the cubic potential by a three-segment PWL function $\phi$.

$$\tilde{\phi}(X) = \{2b(x - x_0), \ x > B_p\}$$
$$= \{-bx, \quad |x| \leq B_p\}$$
$$= \{2b(x + x_0), \ x < -B_p\}$$

$$\tilde{\phi}(x) = 2bx + \frac{3b}{2}(|x - B_p| - |x + B_p|)$$

$$x_0 := \sqrt{\frac{b}{a}}, \quad B_p := \frac{2}{3}\sqrt{\frac{b}{a}}$$

The terms $x_o$ and $B_p$ correspond to the non-origin zeros of the cubic polynomial at $+/-x_o$ and the breakpoints of the PWL approximation at $+/-B_p$, respectively. Clearly, the two breakpoints of $\phi$ divide the phase space into three regions: one inner region, and two outer regions. The resulting linear equations are derived from the Duffing equation after introducing the PWL potential function for the inner and outer regions. The linearity of the differential equations within each subspace permits emulation by means of an essentially linear analog circuit, wherein the circuit parameters change as the system moves from one region to another.

$$\ddot{x} + k\dot{x} - bx = F(t), \ |x| \leq B_p$$

$$\ddot{x} + k\dot{x} - bx = F(t), \ |x| \leq B_p$$

$$\ddot{x} + k\dot{x} - 2bx = F(t) \mp bx_0, \ x \overset{>}{<} \pm B_p$$

Figure 3:
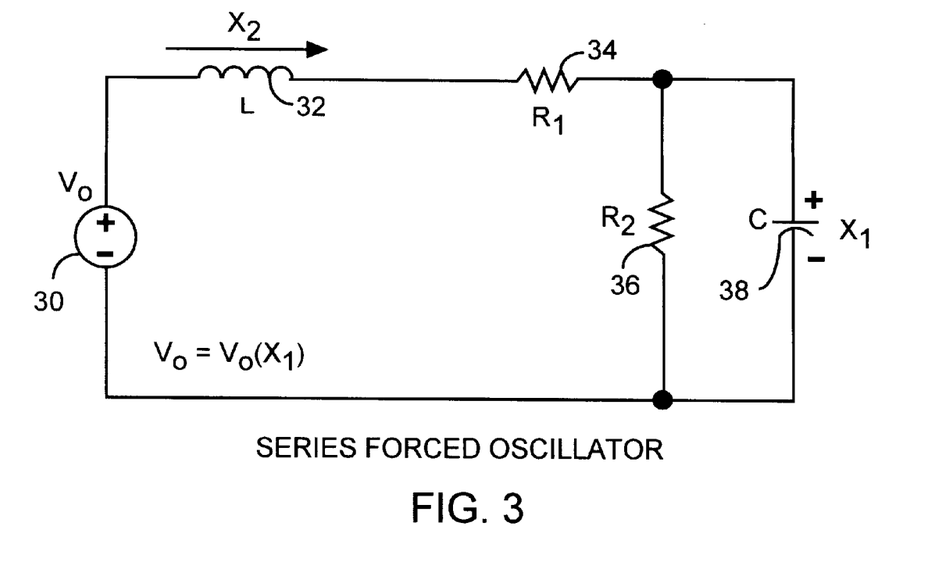
FIG. 3 is an ideal series forced oscillator.
Figure 4:
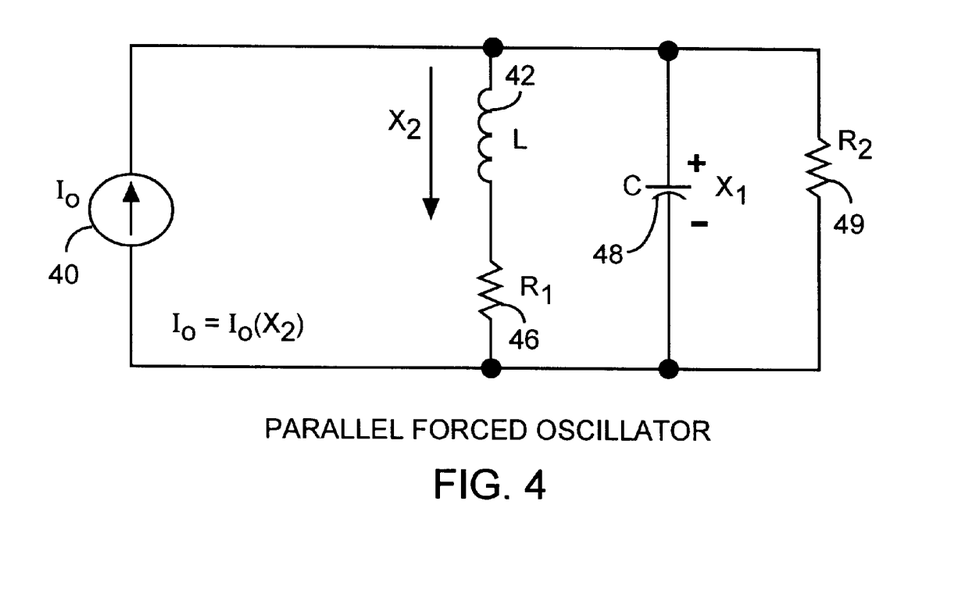
FIG. 4 is an ideal parallel forced oscillator.

There are two general forms of the chaotic oscillator used to realize the PWL Duffing equation. The two forms are duals of one another. FIG. 3 illustrates the series version of the oscillator and FIG. 4 illustrates the parallel version. Both circuits function in the same manner. In the series forced oscillator, a controlled voltage source $V_o$ 30 is connected in series with an inductor L 32 carrying a current X2, a resistor R1 34, and a parallel subcircuit consisting of a resistor R2 36 and a capacitor C 38 across which voltage X1 develops. In the parallel forced oscillator, a controlled current source $I_o$ 40 drives the inductor L 42 carrying a current X2 connected in series with the resistor R1 46, the combination connected in parallel with a capacitor C 48 and resistor R2 49. The voltage X1 develops across capacitor C 48. In each circuit, the state variables are the voltages across the capacitors 38 and 48 denoted by X1 and the currents through the inductors 32 and 42 denoted by X2. For the series circuit, the second-order differential equation written in terms of X1 is the same as the equation for the parallel circuit written in terms of X2.

$$V_o = LC\ddot{x}_1 + (L/R_2 + R_1C_1)\dot{x}_1 + x_1$$

$$I_o = LC\ddot{x}_2 + (L/R_2 + R_1C_1)\dot{x}_2 + x_2$$

These circuit equations are of the second order form for each region when the controlled sources 30 and 40 used in each of the circuits takes on the values depending on the region of interest. In this way, the piecewise linear Duffing equation is realized by either of the two circuits inside each region.

$$V_o = V_o(x_1) = 2bx_1 + F(t), \quad |x_1| \leq B_p$$

$$V_o = V_o(x_1) = -bx_1 \pm 2bx_0 + F(t), \quad x_1 \begin{array}{c}>\\<\end{array} B_p$$

$$I_o = I_o(x_2) = 2bx_2 + F(t), \quad |x| \leq B_p$$

$$I_o = I_o(x_2) = -bx_2 \pm 2bx_o + F(t), \quad x_2 \begin{array}{c}<\\>\end{array} \pm B_p$$

Figure 5:
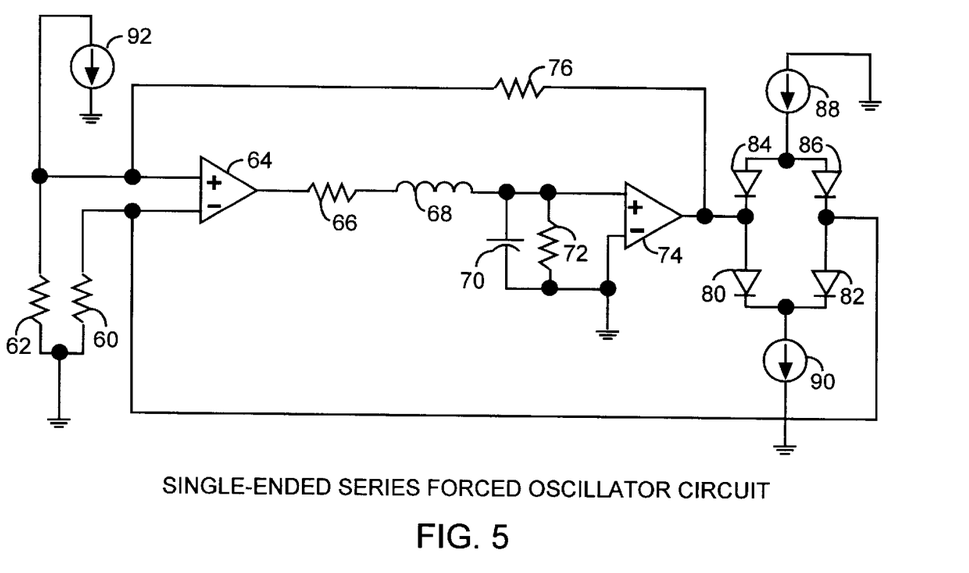
FIG. 5 is a single-ended series forced oscillator circuit.

Referring to FIGS. 3 and 5, the series forced oscillator may be preferably implemented in a series forced oscillator circuit having input resistors 60 and 62, forcing current source 92, and input amplifier 64 driving in series a resistor 66 and inductor 68 connected in series to the parallel subcircuit consisting of capacitor 70 and resistor 72 connected to the input of an output amplifier 74 driving a feedback resistor 76 and driving a diode limiter including diodes 80, 82, 84 and 86 connected between current sources 88 and 90. The diode limiter, using four diodes 80, 82, 84 and 86 and two opposing current sources 88 and 90, which may be large resistors tied to fixed voltage sources, provides the needed nonlinearity. The use of the differential amplifier 64 with the limiter placed in the noninverting signal path allows the composite amplifier gain of amplifiers 64 and 74 to vary as a function of the instantaneous value of the input voltage at the positive input of the amplifier 64. In this way, the diode limiter can define the breakpoints of the composite amplifier transfer function of the circuit.

The naturally high input impedance and low output impedance of the wideband operational amplifiers 64 and 74 are exploited for the proper operation of the series forced oscillator circuit. The state variable in this series forced oscillator circuit is the voltage across the capacitor 70 in the piecewise linear Duffing equation. This series forced oscillator circuit is best suited for low and moderate operating frequency ranges, as dictated by the bandwidth and propagation delay of the operational amplifiers 64 and 74. The implementation of the series forced oscillator circuit can produce chaotic oscillations when sinusoidally forced at 100 MHz, to possess a corner frequency between 125 and 150 MHz, depending on tuning, as shown in FIG. 2. The shape of the frequency spectrum is also tunable according to the amplitude and frequency of the sinusoidal forcing of current source 92, and its relation to the natural resonant frequency of the series forced oscillator circuit. This series forced oscillator circuit with wideband operational amplifiers 64 and 74 and sinusoidal forcing by source 92 at 100 MHz can produce an output spectrum that is flat to about 150 MHz.

Figure 6:
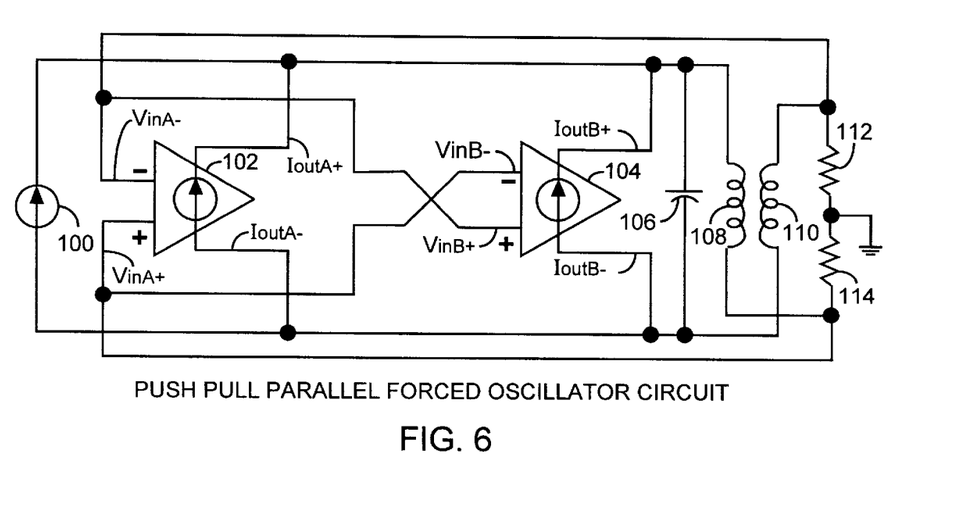
FIG. 6 is a push-pull parallel forced oscillator circuit comprising a linear and a nonlinear voltage controlled current amplifier.
Figure 7:
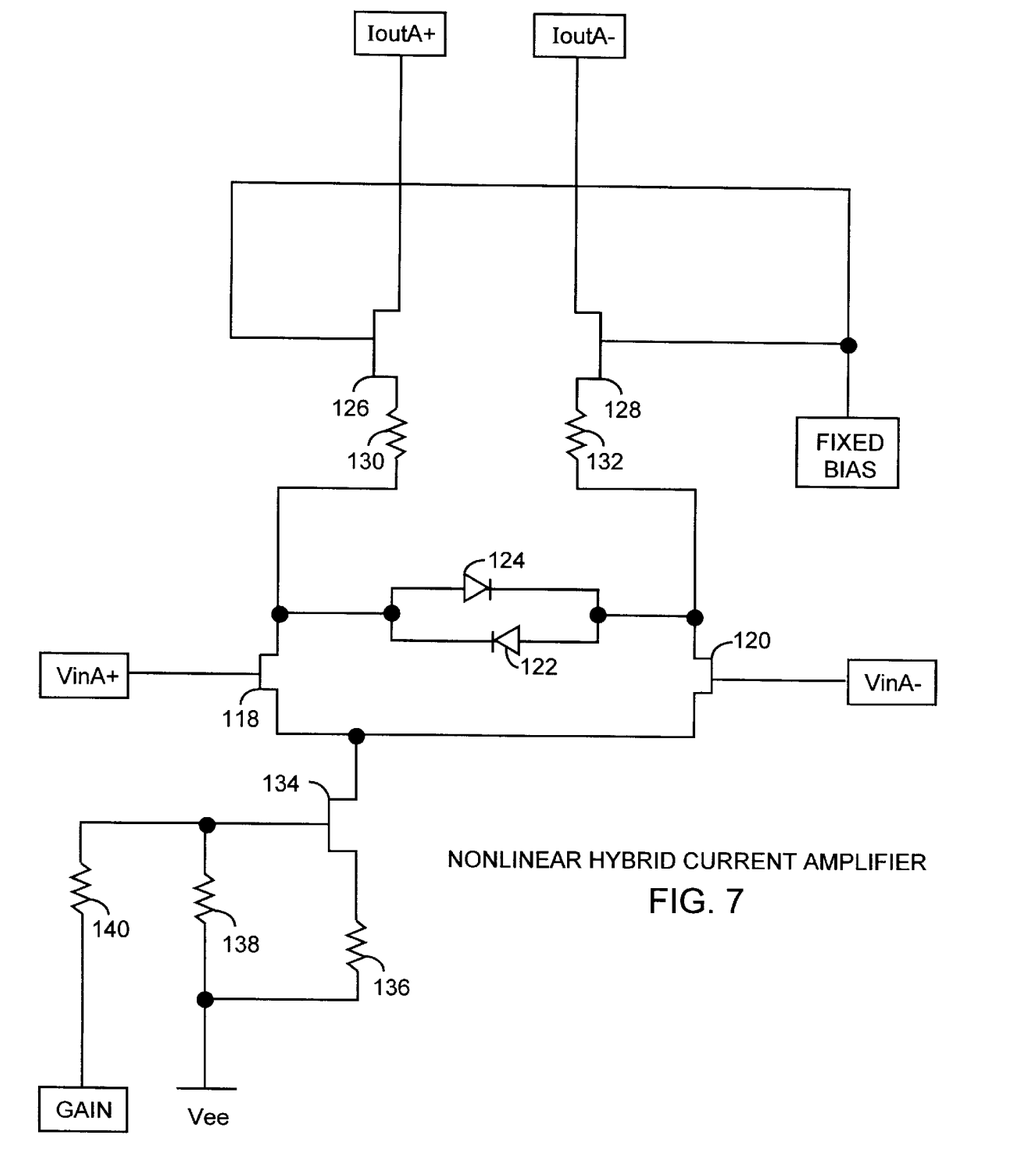
FIG. 7 is a schematic of the nonlinear hybrid current amplifier.
Figure 8:
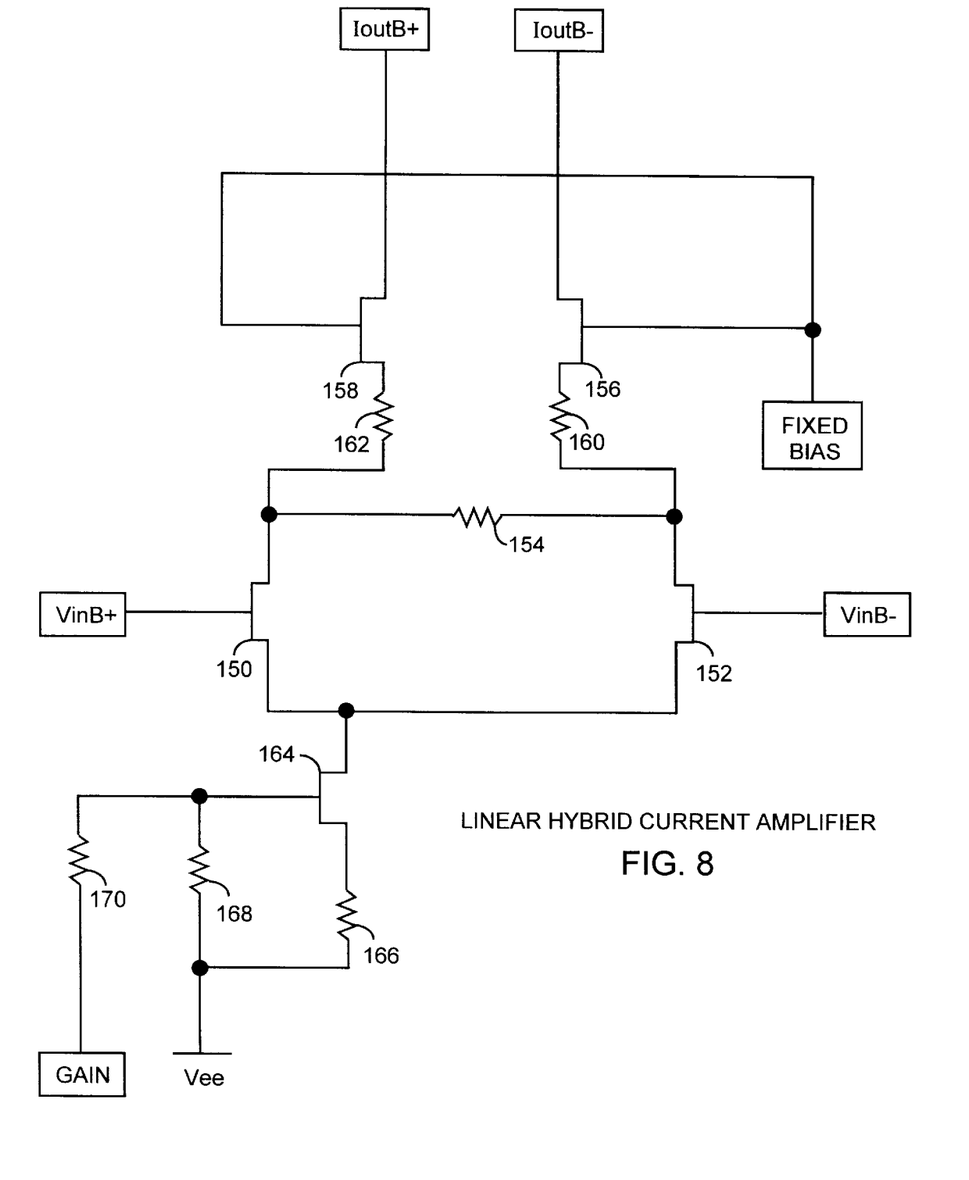
FIG. 8 is a schematic of the linear hybrid current amplifier.

Referring to FIGS. 6, 7, and 8, a forcing current source 100 drives hybrid amplifiers 102 and 104 of the parallel forced oscillator circuit that can offer improved performance. The improved performance stems from amplifiers 102 and 104 having a broad high frequency bandwidth with minimum propagation delay to achieve operation at high microwave frequencies. The parallel forced oscillator circuit is therefore preferably constructed from high frequency hybrid type amplifiers 102 and 104 using a minimum number of parallel stages, as opposed to several stages in series used in the series forced oscillator circuit. The parallel forced oscillator circuit includes the forcing current source 100 connected to the nonlinear hybrid amplifier 102 and the linear hybrid amplifier 104, all three of which drive output capacitor 106 connected to the coupled inductors 108 and 110 that are in turn connected to feedback resistors 112 and 114. The nonlinear amplifier 102 receives inputs Vina+ and Vina−, a gain control voltage, a fixed bias voltage, and Vee power and provides current outputs Iouta+ and Iouta−. The gain control voltage is connected through resistor 140 to the gate of transistor 134. The Vee power is connected through gate resistor 138 and source resistor 136 to the transistor 134, functioning as a current source and connected to both input transistors 118 and 120. The drains of transistors 118 and 120 are connected together through limiting diodes 122 and 124. The input transistors 118 and 120, respectively, drive output transistors 126 and 128 through input resistors 130 and 132, respectively, for providing the output currents Iouta+ and Iouta−. Transistors 126 and 128 also receive a fixed bias voltage that establishes the operation of transistors 126 and 128 as grounded-gate amplifiers. The linear amplifier 104 receives inputs Vinb+ and Vinb−, a gain control voltage, a fixed bias voltage, and Vee power and provides current outputs Ioutb+ and Ioutb−. The gain control voltage is connected through resistor 170 to the gate of transistor 164. The Vee power is connected through a gate resistor 168 and source resistor 166 to a transistor 164, functioning as a current source and connected to the source of both input transistors 150 and 152. The gain-adjusting resistor 154 is connected between the drains of transistors 150 and 152. The input transistors 150 and 152 drive output transistors 158 and 156 through input resistors 162 and 160, respectively, for providing the output currents Ioutb+ and Ioutb−. Transistors 156 and 158 also receive a fixed bias voltage that establishes operation of the transistors 156 and 158 as ground-gated amplifiers.

The drains of the field effect transistors 126, 128, 158, and 156 behave like current sources as a result of having relatively high output impedance. The parallel forced oscillator circuit is therefore the proper choice for higher frequency operation, and the current in the inductors 108 and 110 is the state variable in the piecewise linear Duffing equation. The differential amplifiers 102 and 104 convert signal voltages at respective input gates to a signal current at respective output drains, which is then applied to the parallel RLC subcircuit comprising capacitor 106, inductors 108 and 110 and resistors 112 and 114. The pair of current sensing resistors 112 and 114 are respectively connected in series with inductors 110 and 108 to produce the input voltage for both amplifiers 102 and 104. These resistors 112 and 114 are also part of the RLC passive subcircuit that determines the coefficients in the realized PWL Duffing equation. Using this approach, a signal voltage is produced that is an analog of the current in the inductors 108 and 110 that can be applied to both amplifiers 102 and 104. The nonlinear amplifier 102 contains a diode limiter circuit including diodes 122 and 124.

For the case in which discrete GaAs transistors and lumped elements are used for the parallel RLC subcircuit, forcing frequencies, and hence chaotic oscillation bandwidths in excess of 1 GHz can be achieved. Alternatively, cavity resonators, not shown, can be used to implement the parallel RLC circuit to produce oscillations at still higher forcing frequencies and chaotic bandwidths, assuming that propagation delays are commensurately reduced with suitable feedback for coupling the cavity to the forcing source. Both the series and parallel circuits offer several advantages. The output spectrum is extremely broadband, ranging from near DC to kfo, where the forcing frequency fo<=1/4$T_p$ where $T_p$ is the propagation time, and k has been observed to be between 0.5 to 1.5. All of the circuit parameters are adjustable to obtain the desired qualitative behavior, and to provide the needed tuning flexibility for synchronization. The nonlinearity is ideally a piecewise linear potential function realized by either a diode bridge network or diode limited gain cell that greatly facilitates the matching of two oscillators for synchronization purposes. The realization of a broadband frequency independent negative resistance is not required. The modulation of the circuit output can be accomplished by the angle modulation of the sinusoidal forcing function. The output frequency spectrum is adjustable and can be made nearly flat between DC and the breakpoint. The circuit is uniquely tolerant of amplifier propagation delay, up to approximately ninety degrees of rotation at fo and does not appreciably affect the existence of the chaotic oscillations, and is in contrast to the extremely high sensitivity to propagation delay found for negative resistance based implementations. The qualitative structure of the dynamics is preserved as the operating frequency is increased from baseband to microwave frequencies.

This chaotic oscillator can be used as a carrier or local oscillator for the development of chaos based communications and signal processing technology, especially where some form of privacy, security, or low probability of intercept for the message transmission is desired with benefits over analog communications using traditional techniques. In addition, chaos based communications have the inherent properties of chaos and can also be a competitive alternative to traditional digital communication and encryption techniques. In addition, there are several applications in which a noise like signal with a relatively flat frequency spectrum can be used, ranging from the noise performance of conventional communication components to stealth radar applications where scanning detection and countermeasures by the target would be much more difficult to perform.

The ideal circuits shown in FIGS. 3 and 4 each contain two resistors 34 and 36, and 46 and 49, respectively. Resistor 34 is in series with the inductor 32 and resistor 36 is in parallel with capacitor 38. Resistor 46 is in series with the inductor 42 and resistor 49 is in parallel with capacitor 48. These resistors 34, 36, 46, and 49 are included in FIGS. 3 and 4 in order to make the circuits completely general, and also to make the circuits agree with the Io and Vo differential equations. In the analysis of the actual circuits, the equivalent resistances 34, 36, 46, and 49 are used to represent several real resistive effects that occur in these circuits. For example, the real parts of the input and output impedances of the amplifiers 64, 74, 102, and 104 can be accommodated by including those effects in the resistances 34, 36, 46, and 49. Also, resistances that occur due to the finite Q of the inductors 32 and 42 and capacitors 38 and 48 at high frequencies are accounted for by assigning appropriate values to these resistances 34, 36, 46, and 49. It is also possible to include actual resistive circuit elements 66, 72, 112, and 114 in the real circuits by associating them with these equivalent resistances 34, 36, 46, and 49. For example, the parallel version of the circuit shown in FIG. 6 uses actual resistors 112 and 114 in series with the inductors 108 and 110. These resistors 112 and 114 produce the feedback voltage which is a measure of the current in the inductors 108 and 110 and is fed to amplifiers 102 and 104. The influence of the net resistance which is the combined effect of all of the contributions is determined by solving the second order differential equations using the appropriate values of the equivalent resistances 34, 36, 46, and 49.

The circuits shown in FIGS. 5 and 6 are examples of the series and parallel versions of the piecewise linear Duffing based chaotic oscillator. The primary circuit elements 66, 68, and 70, in the passive RLC subcircuit, within the series version of the oscillator, are in series, as shown in FIG. 5. Similarly, the primary circuit elements 106, and the inductors 108 and 110 in the parallel RLC subcircuit, within the parallel version of the oscillator shown in FIG. 6, are in parallel, as shown in FIG. 6. In addition, the passive RLC subcircuit 66, 68, 70, and 72 in FIG. 5 is connected in series with the output of an operational amplifier 64. The operation of this amplifier 64 is similar to that of an ideal voltage source. Alternatively, the passive RLC subcircuit 106, 108, 110, 112, and 114 in FIG. 6 is connected to the output of a pair of amplifiers 102 and 104 in parallel. The operation of these amplifiers 102 and 104 is similar to that of an ideal current source.

Another significant difference between the two circuits of FIGS. 5 and 6 is that the circuit in FIG. 5 is single-ended, while the circuit of FIG. 6 is push-pull. This difference follows from the design constraints that apply to each circuit differently. For example, the two amplifiers 64 and 74 in FIG. 5, the series version of the circuit, are in series themselves and each consist of multiple stages. Therefore, they easily provide the required gain and signal level needed to make the circuit function properly. A single ended approach works well in this case. However, the cumulative propagation delay introduced by this topology produces an undesirable upper bound on the frequency of operation. The parallel circuit shown in FIG. 6, on the other hand permits parallel operation of the amplifiers 102 and 104, thus reducing the cumulative propagation delay. The delay is further reduced by constructing the amplifiers 102 and 104 with as few stages as possible. The maximum frequency of operation is therefore enhanced. The problem encountered with this approach is that the transconductance produced by each amplifier 102 and 104 is limited by the size of the transistors used. For a broad band amplifier with a minimum number of stages, as the transistor size is increased, the bandwidth of the amplifier is reduced. The use of the push-pull approach in FIG. 6 doubles the effective transconductance of the amplifiers 102 and 104 while keeping the size of the transistors the same.

In order to use the push-pull approach, the passive RLC subcircuit 106, 108, 110, 112, and 114 is constructed using a center-taped inductor. Also, small resistors 112 and 114 are placed in series with each half of the inductors 108 and 110 for the production of a feedback voltage reflecting the current in each half of the inductors 108 and 110. This is the reason for the use of the coupled inductors 108 and 110 found in the parallel version of the circuit shown in FIG. 6.

The particular engineering designs found in the circuits of FIGS. 5 and 6 represent practical engineering solutions to the problems encountered in constructing the series and parallel Duffing based chaotic oscillators. Variations on these methods could be used in order to realize the piecewise linear Duffing equation with the broad form of the invention.

Those skilled in the art can make enhancements, improvements and modifications to the invention, and these enhancements, improvements and modifications may nonetheless fall within the spirit and scope of the following claims.

What is claimed is:

1. An oscillator for generating a chaotic signal, the oscillator comprising, a generator for providing an independent forcing signal, the independent forcing signal is an independent forcing function of time, a passive circuit coupled to the generator for receiving the independent forcing signal, for receiving a dependent controlling signal, the passive circuit comprises a first energy storage element and a second energy storage element for providing a sensed signal and the chaotic signal, a nonlinear circuit coupled to the passive circuit for defining a piecewise linear potential function of the sensed signal for providing the dependent controlling signal, and an active circuit coupled to the passive circuit and to the nonlinear circuit forming multiple feedback paths for controlling the piecewise linear potential function.

2. The oscillator of claim 1, wherein, the dependent controlling signal is a product of the sensed signal multiplied by a derivative of the piecewise linear potential function of the sensed signal.

3. The oscillator of claim 1, wherein, the piecewise linear potential function comprises an inner region having a negative slope and two outer regions each having a positive slope.

4. The oscillator of claim 1, wherein, the passive circuit is a resistive inductive capacitive passive circuit, the first element is an inductor providing the sensed signal, the second element is a capacitor providing the chaotic signal, and the passive circuit further comprises a resistor coupled to the capacitor and the inductor.

5. The oscillator of claim 1, wherein, the passive circuit is a resistive inductive capacitive passive circuit, the first element is a capacitor providing the sensed signal and the chaotic signal, the second element is an inductor, and the passive circuit further comprises a resistor coupled to the capacitor and the inductor.

6. The oscillator of claim 1, wherein, the oscillator is a series forced oscillator, the active circuit comprises an input amplifier and an output amplifier, the generator is coupled to the input amplifier, the nonlinear circuit is a diode bridge coupled to the output amplifier, the passive circuit is a series connected resistive inductive capacitive passive circuit, the first element is an inductor and the second element is a capacitor, the capacitor provides the chaotic signal and the sensed signal, the passive circuit comprises a resistance connected in series with the capacitor and the inductor, and the multiple feedback paths are a first feedback path from the output amplifier to the input amplifier and a second feedback path from the output amplifier through the diode bridge to the input amplifier.

7. The oscillator of claim 1, wherein, the oscillator is a parallel forced oscillator, the active circuit comprises a first amplifier and a second amplifier, the first and second amplifiers each have a differential output that are connected together in parallel forming a common output, the passive circuit is connected across the common output, the passive circuit is a resistive inductive capacitive passive circuit, the first element is a capacitor, the second element is a center-tapped inductor formed by two magnetically coupled inductors, the passive circuit further comprises two resistances coupled to the two inductors, the capacitor is coupled across the common output and coupled to the two inductors, the two resistances are respectively coupled in series with the two inductors, the nonlinear circuit is a pair of limiting diodes coupled to the first amplifier forming a nonlinear amplifier, the second amplifier is a linear amplifier, and the multiple feedback paths are a first feedback path extending from the series couplings between the two inductors and the two resistances through the nonlinear amplifier, and a second feedback path extending from the series coupling between the two inductors and the two resistances through the linear amplifier to the common output.

8. The oscillator of claim 1, wherein the first and second elements provide state variables X1 and X2, and the independent forcing signal plus the dependent controlling signal is a sum defined by a second order differential equation comprising at least one of the state variables X1 or X2, the first and second elements provide constants to a second derivative of the at least one of the state variables X1 or X2.

9. The oscillator of claim 1, wherein, the first element is an inductor L, the second element is a capacitor C, the passive circuit further comprises a resistor R, the capacitor and inductor are connected in parallel, current through the inductor is a state variable X2, and the independent forcing signal plus the dependent controlling signal is a sum Io defined by a second order differential equation comprising the variable X2, where $Io=(LC)\ddot{X}2+K\dot{X}2+X2$, and where K is a constant as a function of at least L and C and R.

10. The oscillator of claim 1, wherein, the first element is an inductor L, the second element is a capacitor C, the passive circuit further comprises a resistor R, the capacitor and inductor are connected in series, the voltage across the capacitor is a state variable X1, and the independent forcing signal plus the dependent controlling signal is a sum Vo defined by a second order differential equation comprising the state variable X1, where $Vo=(LC)\ddot{X}1+K\dot{X}1+X1$, and where K is a constant as a function of at least L and C and R.

11. The oscillator of claim 1, wherein the piecewise linear potential function comprises an inner region having a negative slope −b and a negative outer region and a positive outer region each having a positive slope 2b, the inner region extends between two break points +Bp and −Bp, the first and second elements provide at least one state variable X, the state variable X has an −Xo value where the piecewise linear potential function is zero within the negative outer region, the state variable X has an +Xo value where the piecewise linear potential function is zero within the positive outer region, the independent forcing signal plus the dependent controlling signal is a sum defined by a second order differential equation comprising the state variable X, the first and second elements provide constants to a second derivative of the state variable X, and the piecewise linear potential function is defined as:

$\phi=2b(X-Xo)$, where $X>+Bp$;

$\phi=-bX$, where $|X|\leq Bp$; and $\dot{x}=2b(X+Xo)$, where $X<-Bp$.

12. The oscillator of claim 1, wherein the first element is an inductor and the second element is a capacitor, the passive circuit is a resistive capacitive inductive passive circuit further comprising a resistance means for providing resistance coupled to the inductor and the capacitor.

13. The oscillator of claim 12, wherein the resistance means is parasitic resistance within the oscillator.

14. The oscillator of claim 13, wherein the parasitic resistance means is equivalent resistance of impedance of the active circuit.

15. An oscillator for generating a chaotic signal, the oscillator comprising, a generator for providing an independent forcing signal, a passive circuit coupled to the generator for receiving the independent forcing signal, for receiving a dependent controlling signal, and for providing the chaotic signal, the passive circuit comprises an inductor and a capacitor and a first resistor coupled in parallel, the inductor provides a sensed signal, the capacitor provides the chaotic signal, a nonlinear circuit coupled to the passive circuit for defining a piecewise linear potential function of the sensed signal and for providing the dependent controlling signal, the piecewise linear potential function comprises an inner region having a negative slope and two outer regions each having a positive slope, the dependent signal is a product of the sensed signal multiplied by a derivative of the piecewise linear potential function of the sensed signal, and an active circuit coupled to the passive circuit and to the nonlinear circuit forming multiple feedback paths for controlling the piecewise linear potential function.

16. The oscillator of claim 15, further comprises, a second resistor connected in series with the inductor, the second resistor and the inductor are connected in parallel to the first resistor and to the capacitor.

17. The oscillator of claim 16, wherein the first resistor is parasitic resistance within the oscillator.

18. An oscillator for generating a chaotic signal, the oscillator comprising, a generator for providing an independent forcing signal, a passive circuit coupled to the generator for receiving the independent forcing signal, for receiving a dependent controlling signal, and for providing the chaotic signal, the passive circuit comprises a capacitor and an inductor and a first resistor connected in series, the capacitor provides a sensed signal, a nonlinear circuit coupled to the passive circuit for defining a piecewise linear potential function of the sensed signal for providing the dependent controlling signal, the piecewise linear potential function has three linear regions, an inner region having a negative slope and two outer regions each having a positive slope, the dependent signal is a product of the sensed signal multiplied by a derivative of the piecewise linear potential function of the sensed signal, and an active circuit coupled to the passive circuit and to the nonlinear circuit forming multiple feedback paths for controlling the piecewise linear potential function.

19. The oscillator of claim 18 further comprises a second resistor connected in parallel with the capacitor, the second resistor and the capacitor are connected in series with the inductor and the first resistor.

20. The oscillator of claim 19, wherein the first and second resistors are parasitic resistances within the oscillator.

\* \* \* \* \*